United States Patent [19]
Grieger et al.

[11] Patent Number: 6,100,198
[45] Date of Patent: Aug. 8, 2000

[54] POST-PLANARIZATION, PRE-OXIDE REMOVAL OZONE TREATMENT

[75] Inventors: Eric K. Grieger, Chandler; Tim J. Kennedy, Boise; Robert H. Whitney, Eagle; Gunnar A. Barnhart, Boise, all of Id.

[73] Assignee: Micron Technology, Inc., Boise, Id.

[21] Appl. No.: 09/032,229

[22] Filed: Feb. 27, 1998

[51] Int. Cl.[7] .............................. H01L 21/00; B08B 3/04
[52] U.S. Cl. ...................... 438/692; 697/745; 697/753; 697/756
[58] Field of Search .................................. 438/745, 753, 438/756, 697, 691, 692

[56] References Cited

U.S. PATENT DOCUMENTS

| 4,749,640 | 6/1988 | Tremont et al. | 430/314 |
| 5,516,730 | 5/1996 | Saeed et al. | 437/235 |
| 5,626,681 | 5/1997 | Nakano et al. | 134/3 |
| 5,803,980 | 9/1998 | Pas et al. | 134/2 |
| 5,837,662 | 11/1998 | Chai et al. | 510/175 |

FOREIGN PATENT DOCUMENTS

0259985A2  3/1988  United Kingdom.

OTHER PUBLICATIONS

Wolf, Stanley, Ph.D. and Tauber, Richard N., Ph.D., "Wet Processing: Cleaning, Etching, and Liftoff", *Silicone Processing For The VLSI Era*, vol. 1, Process Technology, Lattice Press, 15:514–520, 1986.

Primary Examiner—Benjamin L. Utech
Assistant Examiner—Lynette T. Umez-Eronini
Attorney, Agent, or Firm—Dorsey & Whitney LLP

[57] ABSTRACT

Washing a microelectronic substrate with an ozonated solution following planarization and proceeding removal of a native oxide layer through acid etching.

30 Claims, 2 Drawing Sheets

POST-PLANARIZATION, PRE-OXIDE REMOVAL OZONE TREATMENT

TECHNICAL FIELD

This invention relates to microelectronic device fabrication, and more particularly to processes and compositions for cleaning microelectronic substrates or wafers.

BACKGROUND OF THE INVENTION

Microelectronic device fabrication typically requires numerous steps from the manufacturing of microelectronic substrates, such as silicon wafers, to the formation of discrete components on the microelectronic substrate. The steps often include planarization, depositioning, and etching.

Planarization may be accomplished through either mechanical planarization or chemical-mechanical planarization techniques. Mechanical planarization involves the removal of a surface layer of material from a substrate by a coarse pad. Chemical-mechanical planarization (CMP) involves the application of a specially formulated slurry to a surface of a substrate and the agitation of the slurry by a scrubbing pad to achieve a highly planarized surface. Planarization is an important step in preparing the substrate for the depositioning and etching steps which form the microelectronic components on the substrate's surface. The depositioning steps employ various processes to form layers on the surface of the substrate from a variety materials, such as oxides and polysilicon. The etching steps employ various processes to remove material from the layers formed on the substrate surface. Etching may involve the complete removal of a layer, such as the complete removal of a native oxide layer from a polysilicon layer. Etching may also involve the removal of a portion of a layer to define specific geometries in the layer, such as the etching of a polysilicon layer. The formation of the microelectronic devices will often employ numerous successive depositioning and etching steps.

Clean substrates are critical to obtaining high yields in microelectronic device fabrication. Numerous contaminants can interfere with fabrication and are generally classified as being either particulates or films. These contaminants can occur from a variety of sources and may include contaminants such as: silicon dust, quartz dust, atmospheric dust, and particles from the clean room personnel and particles from the processing equipment. Often, the source of the contamination will be one of the processing steps. While the fabrication process is generally designed to eliminate as many sources of contamination as possible, numerous extra processing steps must be performed to remove contaminants to prevent interference by the contaminants with successive processing steps. These cleaning steps may include steps for removing soluble contaminates from the substrate, such as washing the substrate by: immersion in a bath, immersion in a dump rinser, use of centrifugal spray cleaners, and use of rinser dryers. These steps usually employ deionized (DI) water as the principal solvent. Removal of insoluble particulate contamination may be performed through other or additional steps, such as: ultrasonic scrubbing, high-pressure spraying and, or, mechanical scrubbing.

The planarization process is a significant source of particulate contaminants. In particular, the planarization, particularly the CMP process leaves carbon on the substrate surface. This byproduct of the planarization process interferes with an acid etching step that removes a native oxide layer that typically builds up on the substrate surface. The incomplete removal of the native oxide layer interferes with the subsequent removal of polysilicon from the backside of the substrate through a polysilicon etching step.

SUMMARY OF THE INVENTION

The present invention overcomes the limitations of the prior art by washing a microelectronic substrate with an ozonated solution after planarization and, or, before acid etching of an oxide layer formed on the substrate. The ozonated solution preferably comprises DI water into which ozone has been dispersed.

In one exemplary embodiment, ozone is introduced into a tank of DI water and allowed to saturate the DI water for approximately one minute. The microelectronic substrates are dipped into the ozonated bath for between approximately 30 seconds and 5 minutes. The substrates are rinsed with a DI water and ozone rinse after being removed from the bath. Removal of an oxide layer is performed by acid etching the substrate with an acid etch solution. The acid etching solution may, for example, comprise water, hydrofluoric acid (HF) and tetramethylammonium hydroxide (TMAH) in an approximate ratio of 100:1:6, respectively. The substrate is then rinsed in a cascade overflow of DI water for approximately 5 minutes. Etching of the polysilicon is then performed with a solution consisting, for example, of approximately 2.25% of TMAH for approximately 5 minutes at 30° C. The substrate is again rinsed in a cascade overflow of DI water for approximately 5 minutes, followed by a mechanical scrub.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures, processes, and materials associated with microelectronic device fabrication have not been shown in detail in order to avoid unnecessarily obscuring the description of the embodiments of the invention.

Figure 1:
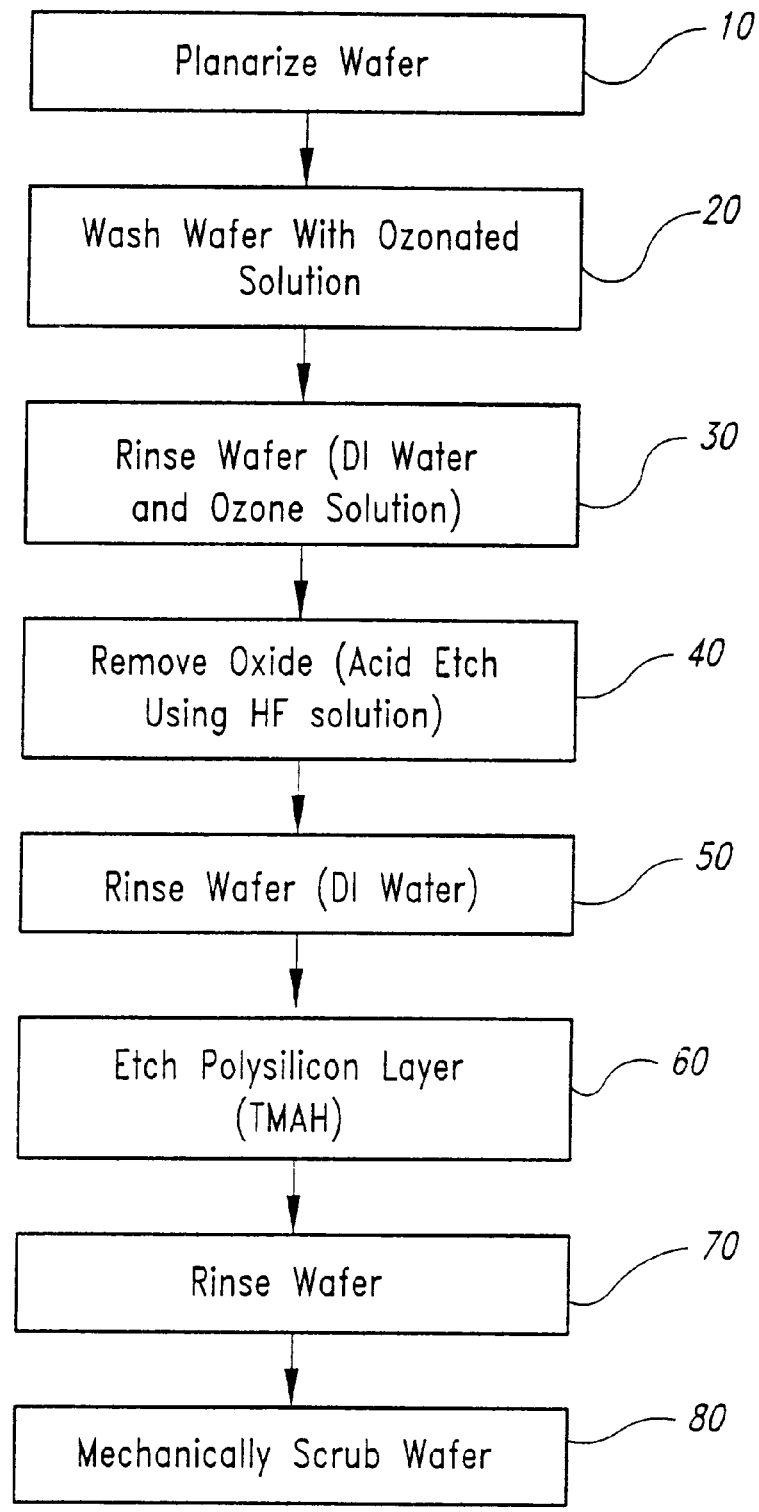
FIG. 1 is a flowchart of the steps according to one exemplary embodiment of the invention.

Referring to FIG. 1, in an exemplary embodiment, a substrate is planarized through, for example, chemical-mechanical planarization (CMP) in step 10. In CMP, a slurry is flowed between the substrate and a pad that is moved relative to the substrate for buffing the substrate with the slurry. The slurry contains a chemical that dissolves the substrate and an abrasive that physically removes the dissolved layer. Planarization may be used for initially preparing the surface of the substrate, or may be used at other points in the fabrication process where a planar surface is desired.

In step 20, the planarized substrate is washed with an ozonated solution. In one exemplary embodiment of a masking step 20' shown in FIG. 2, ozone is introduced into a tank containing deionized (DI) water in step 22. The ozone may be introduced through dispersion tubes located in the bottom of the tank. The DI water is allowed to become saturated with ozone for one minute prior to the immersion of the substrate into the resulting ozonated bath or solution, step 24. While there are no upper or lower time limits for the immersion, an immersion time between 30 seconds and 5 minutes appears suitable, with approximately one minute being preferred. The ozonated solution may have a relatively neutral pH, thus providing distinct advantages in handling and disposal over more acidic solutions.

Referring back to FIG. 1, the substrate is rinsed after being removed from the ozone solution, in step 30. The rinse may be performed by, for example, placing the substrate in a cascade overflow of DI water for approximately 5 minutes. Ozone may be introduced in the DI water rinse.

An acid etching step 40, follows the DI water rinse for removing the native oxide that typically forms on the surface of the substrate. The acid etching may be accomplished with an acid etching solution containing, for example, a hydrofluoric (HF) acid. A suitable acid etching solution has been found to be water, hydrofluoric acid (HF), and tetramethylammonium hydroxide (TMAH) in the approximate ratio of 100:1:6, respectively. Such as solution has be found to be suitable if applied to the surface of the substrate for approximately 1 minute at a temperature of approximately 21.5° C.

In step 50, residue from the acid etch is removed by rinsing the substrate. The rinse may again consist of placing the substrate in a cascade overflow of DI water for approximately 5 minutes.

Etching of a polysilicon layer takes place in step 60. The polysilicon etching may be performed using a solution that is, for example, approximately 2.25% by weight of TMAH. Application of the TMAH solution to the substrate for approximately 5 minutes at approximately 30° C. has been found suitable.

Following the polysilicon etching, in step 70 the substrate is again rinsed by placing the substrate in a DI water cascade overflow rinse for approximately 5 minutes. After the rinse, in step 80, an additional cleaning step is performed such as a mechanical scrub by a porous brush over the substrate surface.

Figure 2:
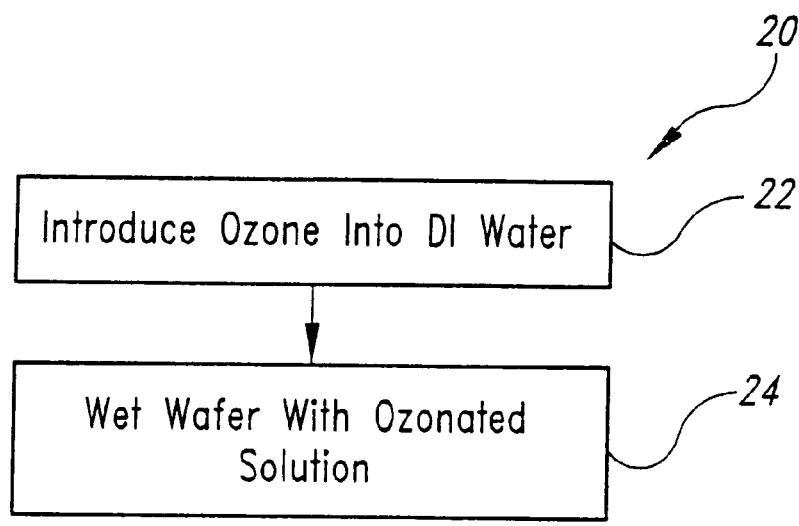
FIG. 2 is a flowchart of the steps of washing the substrate with ozonated solution according to one exemplary embodiment of the invention.
Figure 3:
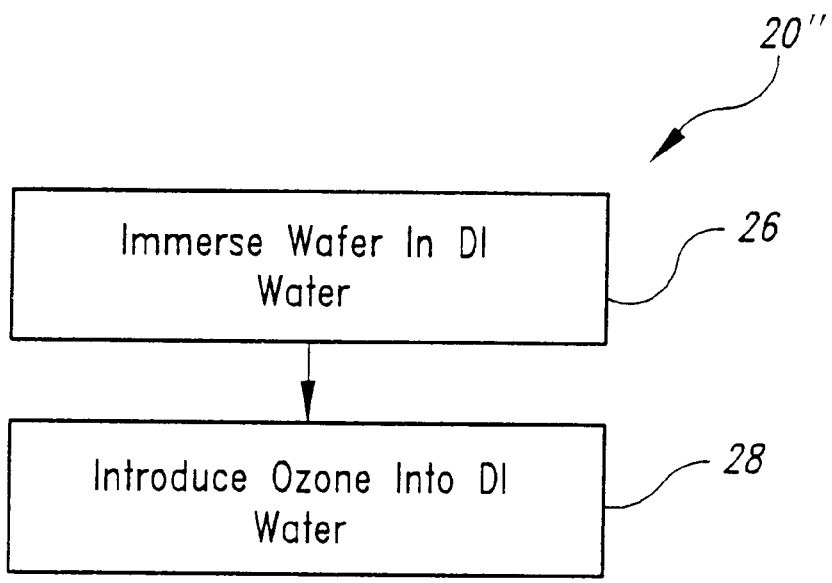
FIG. 3 is a flowchart of the steps of washing the substrate with ozonated solution according to an alternative exemplary embodiment of the invention.

FIG. 3 shows an exemplary embodiment of a masking step 20" that may be used in place of the masking step 20' shown in FIG. 2. In step 26, the substrate is first immersed in the DI water. The immersion of the substrate is followed by the introduction of ozone into the DI water, as in step 28. In a further alternative embodiment, the substrate may be introduced into the DI water at the same time that the ozone is being introduced into the DI water.

One skilled in the art will appreciate that the substrate may be washed with the ozonated solution by conventional methods other than a bath or immersion. For example, the ozonated solution may be sprayed onto the surface of the substrate.

Although specific embodiments of, and examples for, the present invention are described herein for illustrative purposes, various equivalent modifications can be made without departing from the spirit and scope of the invention, as will be recognized by those skilled in the relevant art. The teachings provided herein of the present invention can be applied to other processes for microelectronic device fabrication, not necessarily the exemplary microelectronic device fabrication process generally described above. For example, rinse steps may be added or deleted while realizing the advantages of the invention. The rinse steps may be performed in a manner other than a cascade overflow bath, such as immersion in a dump rinser, centrifugal spray cleaning, or through the use of rinser dryer devices. In addition, other steps may be interposed in the process between the planarization step, the oxide removal, and the polysilicon etch.

These and other changes can be made to the invention in light of the above detailed description. In general, in the following claims, the terms used should not be construed to limit the invention to the specific embodiments disclosed in the specification and the claims, but should be construed to include all processes and compositions that operate in accordance with the claims to provide a method for manufacturing microelectronic devices. Accordingly, the invention is not limited by the disclosure, but instead its scope is to be determined entirely by the following claims.

We claim:

1. A method of processing a wafer, comprising:

planarizing the wafer though chemical-mechanical planarization;

washing the planarized wafer in an ozonated solution;

acid etching the wafer after the ozone washing; and etching a polysilicon layer on the wafer.

2. The method of claim 1 wherein washing the planarized wafer includes:

introducing ozone into a volume of water; and wetting the wafer with water and ozone solution.

3. The method of claim 1 wherein washing the planarized wafer includes:

introducing ozone into a volume of deionized water; and wetting the wafer with deionized water and ozone solution.

4. The method of claim 3 wherein the introducing ozone into a volume of deionized water is performed before the wetting of the wafer with the deionized water and ozone solution.

5. The method of claim 3 wherein the introducing ozone into a volume of deionized water is performed after the wetting of the wafer with the deionized water and ozone solution.

6. The method of claim 3 wherein the introducing ozone into a volume of deionized water is performed during the wetting of the wafer with the deionized water and ozone solution.

7. The method of claim 1 wherein washing the planarized wafer includes:

saturating a volume of water with ozone; and wetting the wafer with the saturated solution.

8. The method of claim 1 wherein washing the planarized wafer includes:

saturating a volume of deionized water with ozone; and wetting the wafer with the saturated solution.

9. The method of claim 1 wherein washing the planarized wafer includes:

introducing ozone into a volume of deionized water to saturate the solution for at least one minute prior to wetting the wafer with the saturated solution.

10. The method of claim 1 wherein washing the planarized wafer includes:

introducing ozone into a volume of water to saturate the solution for at least one minute prior to wetting the wafer with the saturated solution.

11. The method of claim 1 wherein the acid etching includes supplying a solution containing hydrofluoric acid to the wafer.

12. The method of claim 11, further comprising rinsing the wafer between the washing and the acid etching.

13. The method of claim 12 wherein rinsing the wafer includes immersing the wafer in a cascade overflow deionized water rinse.

14. The method of claim 12 wherein rinsing the wafer includes immersing the wafer in a cascade overflow deionized water and ozone rinse.

15. The method of claim 1 wherein the acid etching includes supplying a solution to the wafer of water, HF and tetramethylammonium hydroxide in the ratio of approximately 100:1:6, respectively.

16. The method of claim 1 wherein etching a polysilicon layer on the wafer includes applying a solution containing tetramethylammonium hydroxide to the polysilicon layer.

17. The method of claim 1, further comprising performing a rinse between the acid etching and the polysilicon etching.

18. The method of claim 17, wherein performing a rinse between the acid etching and the polysilicon etching includes the step of immersing the wafer in a cascade overflow deionized water rinse.

19. The method of claim 1, further comprising performing a mechanical scrub on the wafer after the polysilicon etching.

20. The method of claim 19 wherein a rinse is performed between the polysilicon etching and the performing a mechanical on the wafer.

21. A method of cleaning a wafer having a polysilicon layer, the method comprising:

supplying a water and ozone solution to the wafer;

acid etching the wafer after supplying the solution; and etching the polysilicon after the acid etching.

22. The method of claim 21, further comprising planarizing the wafer through mechanical planarization prior to supplying the solution.

23. The method of claim 22, further comprising rinsing the wafer with a rinse comprising deionized water and ozone between supplying the solution and the acid etching the wafer.

24. The method of claim 22, further comprising rinsing the wafer with a rinse comprising deionized water between the supplying the solution and the acid etching the wafer.

25. The method of claim 22, further comprising rinsing the wafer with a rinse comprising deionized water between the acid etching the wafer and etching the polysilicon.

26. The method of claim 21 wherein supplying a water and ozone solution to the wafer includes:

supplying a volume of deionized water;

introducing ozone into the volume of deionized water; and immersing the wafer into the solution of deionized water and ozone.

27. The method of claim 26, further comprising permitting the deionized water to become saturated with ozone prior to immersing the wafer in the solution of deionized water and ozone.

28. The method of claim 21 wherein acid etching the wafer includes supplying a solution comprising hydrofluoric acid and water to the wafer.

29. The method of claim 21 wherein acid etching the wafer includes supplying a solution comprising hydrofluoric acid, tetramethylammonium hydroxide and water to the wafer.

30. A wafer carrying a polysilicon layer cleaned by the process of:

planarizing the wafer through chemical-mechanical planarization;

washing the wafer in a solution comprising water and an effective concentration of ozone after the planarizing the wafer;

acid etching the wafer after the washing the wafer;

rinsing the wafer with deionized water; and etching the polysilicon layer.

* * * * *

UNITED STATES PATENT AND TRADEMARK OFFICE
CERTIFICATE OF CORRECTION

PATENT NO. : 6,100,198
DATED : August 8, 2000
INVENTOR(S) : Eric K. Grieger, Tim J. Kennedy, Robert H. Whitney, and Gunnar A. Barnhart It is certified that error appears in the above-identified patent and that said Letters Patent is hereby corrected as shown below:

Column 4,
Line 18, "the wafer though" should read -- the wafer through --

Column 5,
Line 1, "claim 11, further" should read -- claim 1, further --

Signed and Sealed this

Twelfth Day of February, 2002

Attest:

Attesting Officer

JAMES E. ROGAN
Director of the United States Patent and Trademark Office